United States Patent [19]
Goto

[11] Patent Number: 5,036,021
[45] Date of Patent: Jul. 30, 1991

[54] METHOD OF PRODUCING A SEMICONDUCTOR DEVICE WITH TOTAL DIELECTRIC ISOLATION

[75] Inventor: Hiroshi Goto, Kawasaki, Japan

[73] Assignee: Fujitsu Limited, Kanagawa, Japan

[21] Appl. No.: 259,558

[22] Filed: Oct. 18, 1988

[30] Foreign Application Priority Data

Oct. 19, 1987 [JP] Japan .................. 62-263345

[51] Int. Cl.$^5$ .................................... H01L 21/76
[52] U.S. Cl. .................................. 437/62; 437/31;
      437/67; 437/84; 437/228; 437/235
[58] Field of Search ............... 437/61, 62, 67, 89,
      437/90, 84, 228, 235, 31, 28; 148/DIG. 150,
      DIG. 50

[56] References Cited

U.S. PATENT DOCUMENTS

| | | | |
|---|---|---|---|
| 3,343,255 | 9/1967 | Donovan | 437/974 |
| 3,391,023 | 7/1968 | Frescura | 437/974 |
| 3,445,925 | 5/1969 | Lesk | 437/974 |
| 3,462,322 | 8/1969 | Hennings et al. | 437/974 |
| 3,997,381 | 12/1976 | Wanlass | 156/657 |
| 4,050,979 | 9/1977 | Smeltzer et al. | 437/974 |
| 4,118,857 | 10/1978 | Wong | 437/974 |
| 4,177,094 | 12/1979 | Kroon | 437/974 |
| 4,601,779 | 7/1986 | Abernathey et al. | 437/974 |
| 4,649,627 | 3/1987 | Abernathey et al. | 437/974 |

FOREIGN PATENT DOCUMENTS

| | | | |
|---|---|---|---|
| 58-9334 | 1/1983 | Japan . | |
| 0064045 | 4/1983 | Japan | 437/62 |
| 0182241 | 8/1986 | Japan | 437/62 |

OTHER PUBLICATIONS

E. D. Palik et al., Study of Etch Stop Mechanism in Silicon, J. of Electrochem. Society, vol. 129, No. 9, pp. 2051-2058.

Primary Examiner—Brian E. Hearn
Assistant Examiner—Tom Thomas
Attorney, Agent, or Firm—Armstrong, Nikaido, Marmelstein, Kubovcik & Murray

[57] ABSTRACT

A method of producing a semiconductor device comprises the steps of preparing a stacked structure having an $n^-$-type semiconductor substrate, an $n^+$-type diffusion layer formed on the $n^-$-type semiconductor substrate and an oxide layer formed on the $n^+$-type diffusion layer, adhering a base substrate on the oxide layer, removing the $n^-$-type semiconductor substrate in its entirety by an etching, forming an $n^-$-type semiconductor layer on the $n^+$-type diffusion layer to a predetermined thickness by an epitaxial growth, and forming at least an element in the $n^-$-type semiconductor layer which constitutes an active layer.

9 Claims, 5 Drawing Sheets

METHOD OF PRODUCING A SEMICONDUCTOR DEVICE WITH TOTAL DIELECTRIC ISOLATION

BACKGROUND OF THE INVENTION

The present invention generally relates to methods of producing a semiconductor device, and more particularly to a method of producing a semiconductor device having an element such as a bipolar transistor with a silicon on insulator (SOI) structure using a wafer bonding technique.

The SOI structure using the wager bonding technique was proposed back in the 1960's. A semiconductor device having the so-called dielectric isolation structure is also known, where the dielectric isolation structure is obtained by forming on a dielectric substrate a thin silicon layer which is made by etching back a monocrystalline silicon (Si) substrate.

Recently, many attempts have been made to combine such structures to produce a semiconductor device having a high quality. But when producing such a semiconductor device, the formation of the high impurity concentration buried layer plays an important role.

FIGS. 1A through 1E are cross sectional views for explaining a conventional method of producing a semiconductor device having the SOI structure. Such a conventional method is disclosed in the Japanese Laid-Open Patent Application No. 58-9334, for example.

In FIG. 1A, an n-type silicon (Si) wafer 1 having a thickness of 300 microns is prepared and an n+-type diffusion layer 2 is formed in the n-type Si wafer 1 to a thickness of approximately 20 microns. The n+-type diffusion layer 2 has a resistivity in a range of several to several tens of mΩcm. Hence, a low-resistivity buried layer is formed in advance.

In FIG. 1B, an anodized layer 3 is formed in the n+-type diffusion layer 2 to a thickness of approximately 10 microns by an anodization.

In FIG. 1C, an adhesive layer 5 is formed on a semiconductor wafer 4 which is used as a base substrate, and the anodized layer 3 is bonded on the semiconductor wafer 4 through the adhesive layer 5. A pressure of approximately 200 g/cm² is applied on the pair of wafers 1 and 4 and the stacked structure is heated for approximately 3 minutes at approximately 100° C. Thereafter, the stacked structure is subjected to a thermal process for several tens of minutes at 1000° C. so as to evaporate an organic component of the adhesive layer 5. As a result, a combined wafer 6 is made including the wafers 1 and 4 which are bonded together by the adhesive layer 5.

In FIG. 1D, a photoresist layer (not shown) is formed on the semiconductor wafer 4 and approximately 260 microns of the n-type Si wafer 1 is removed by an etching using an etchant including hydrofluoric acid (HF), nitric acid (HNO$_3$) and acetic acid (CH$_3$COOH) with a ratio 1:3:1. As a result, an n-type region 1a of approximately 20 microns remains on the N+-type diffusion layer 2.

In FIG 1E, an SiO$_2$ insulator layer 11 is formed on the n-type region 1a, and windows (not shown) are formed in the SiO$_2$ insulator layer 11 for forming a p-type region 8 by an ion implantation through the SiO$_2$ insulator layer 11. Thereafter, an N+-type region 9 is formed in the p-type region 8 and an N+-type region 10 is formed in the n-type region 1a by an ion implantation through holes formed in the SiO$_2$ insulator layer 11. As a result, elements 7a, 7b and 7c are formed in the n-type region 1a. Each of the elements 7a through 7c have the p-type region 8 which becomes a base region of an npn bipolar transistor, the N+-type region 9 which becomes an emitter region of the npn bipolar transistor and the N+-type region 10 which is used for forming a portion of a collector electrode of the npn bipolar transistor. Finally, a base electrode, an emitter electrode and a collector electrode (all not shown) are formed at respective holes in the SiO$_2$ insulator layer 11 located above the p-type region 8, the N+-type region 9 and the N+-type region 10.

However, when removing a portion of the n-type Si wafer 1 by the etching which uses the etchant including HF, HNO$_3$ and CH$_3$COOH, it is extremely difficult to carry out the etching so that the thickness of the n-type region 1a is controlled with a high accuracy. As a result, there is a problem in that the thickness of the n-type region 1a remaining on the N+-type diffusion layer 2 is inconsistent because the etching of the n-type wafer 1 cannot be controlled with a high accuracy. When the thickness of the n-type region 1a is inconsistent, there is a problem in that the inconsistency in the characteristics of the elements formed in the n-type region 1a becomes large since the n-type region 1a is used as an active region in which the elements of the semiconductor device are formed. Therefore, it is impossible to produce semiconductor devices having desired element characteristics with a high yield.

SUMMARY OF THE INVENTION

Accordingly, it is a general object of the present invention to provide a novel and useful method of producing a semiconductor device in which the problems described above are eliminated.

Another and more specific object of the present invention is to provide a method of producing a semiconductor device in which an active region is formed by an epitaxial growth process. According to the method of the present invention, it is possible to accurately control the thickness of the active layer. For this reason, it is possible to accurately control characteristics of elements formed in the active layer of the semiconductor device, and semiconductors having desired element characteristics can be produced with a high yield.

Still another object of the present invention is to provide a method of producing a semiconductor device comprising the steps of preparing a stacked structure having an n-type semiconductor substrate having a first impurity concentration, an n-type first layer having a second impurity concentration higher than the first impurity concentration formed on the n-type semiconductor substrate and an insulation layer formed on the n-type first layer, adhering a base substrate on the insulation layer, removing the n-type semiconductor substrate in its entirety by an etching, the etching having a high etching rate for the n-type semiconductor substrate than for the n-type first layer, forming an n-type second layer having a third impurity concentration lower than the second impurity concentration on the n-type first layer to a predetermined thickness by an epitaxial growth, and forming at least an element in the n-type second layer which constitutes an active layer. According to the method of the present invention, it is possible to form the n-type second layer which constitutes the active layer to a desired thickness with an extremely high accuracy. Accordingly, it is possible to accurately control characteristics of elements formed in the active layer of the semiconductor device, and semiconductor devices having desired element characteristics can be produced with a high yield.

A further object of the present invention is to provide a method of producing a semiconductor device comprising the steps of forming an insulation layer on an n-type semiconductor substrate having a first impurity concentration, adhering a base substrate on the insulator layer, removing by a polishing or etching a predetermined thickness of the n-type semiconductor substrate from a surface of the n-type semiconductor substrate opposite a surface on which the insulation layer is formed, forming an n-type semiconductor layer on a remaining portion of the n-type semiconductor substrate to a predetermined thickness by an epitaxial growth, the n-type semiconductor layer having a second impurity concentration lower than the first impurity concentration, and forming at least an element in the n-type semiconductor layer which constitutes an active layer. According to the method of the present invention, it is possible to produce semiconductor devices having desired element characteristics by simple production processes.

Another object of the present invention is to provide a method of producing a semiconductor device comprising the steps of forming an insulation layer on an n-type semiconductor substrate having a first impurity concentration, adhering a base substrate on the insulator layer, removing by a polishing or etching a predetermined thickness of the n-type semiconductor substrate from a surface of the n-type semiconductor substrate opposite a surface on which the insulation layer is formed, doping n-type impurities into a remaining portion of the n-type semiconductor substrate so as to convert the remaining portion of the n-type semiconductor substrate into an n-type first layer having a second impurity concentration higher than the first impurity concentration, forming an n-type second layer on the n-type first layer to a predetermined thickness by an epitaxial growth, the n-type second layer having a third impurity concentration lower than the second impurity concentration, and forming at least an element in the n-type second layer which constitutes an active layer.

Other objects and further features of the present invention will be apparent from the following detailed description when read in conjunction with the accompanying drawings.

DETAILED DESCRIPTION

FIGS. 2A through 2J are cross sectional views respectively showing a semiconductor device at various stages of a production process which is in conformance with a first embodiment of a method of producing a semiconductor device according to the present invention.

Figure 1A:
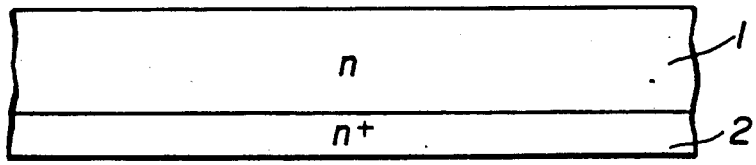
FIGS. 1A through 1E are cross sectional views for explaining a conventional method of producing a semiconductor device having an SOI structure.
Figure 1B:
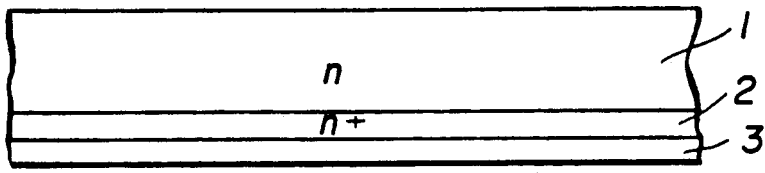
Figure 1C:
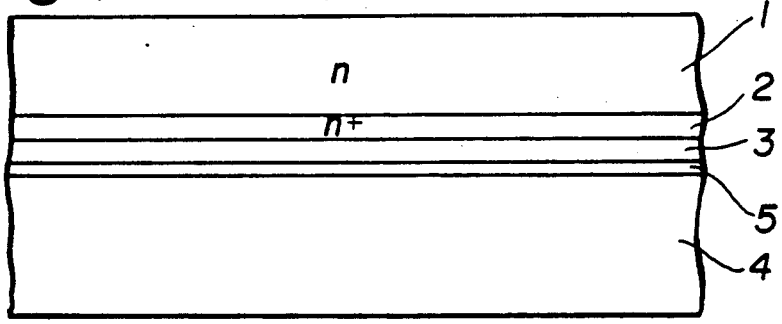
Figure 1D:
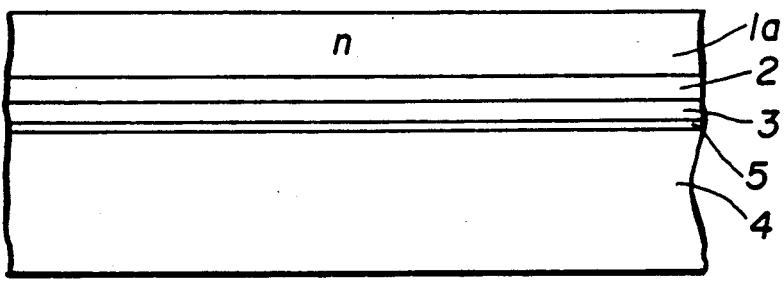
Figure 1E:
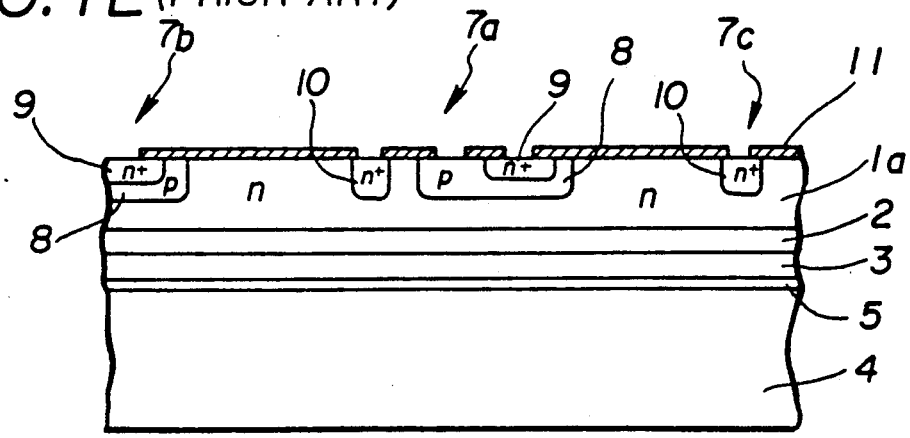
Figure 2A:
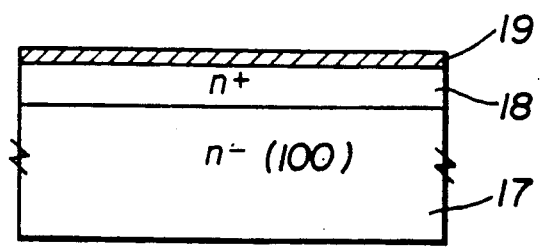
FIGS. 2A through 2J are cross sectional views for explaining a first embodiment of a method of producing a semiconductor device according to the present invention.

In FIG. 2A, an $n^-$-type monocrystal Si substrate 17 is (100) plane oriented. The $n^-$-type Si substrate 17 has a thickness in the order of 500 microns and a resistivity of several $\Omega$cm. An $N^+$-type diffusion layer 18 having a sheet resistance in the order of 20 $\Omega/\square$ is formed on the $n^-$-type Si substrate 17. For example, this $N^+$-type diffusion layer 18 is formed to a thickness in a range of 1.5 microns to 2.0 microns by an ion implantation which injects arsenide (As) ions at an energy of 60 kV to a dosage of $5 \times 10^{15}$ atoms per cm$^2$ and a subsequent thermal process at 1000° C. for a time of 100 minutes. The $N^+$-type diffusion layer 18 can also be formed by a thermal diffusion. Thereafter, an oxidation process oxidizes a surface of the $N^+$-type diffusion layer 18 to form an oxide layer 19.

Figure 2B:
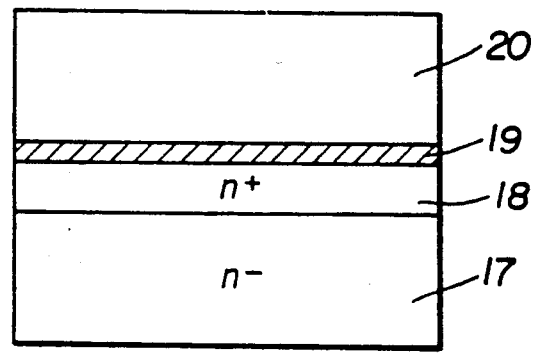

In FIG. 2B, a wafer 20 which is used as a base substrate is adhered on the oxide layer 19 by a thermal bonding process.

Figure 2C:
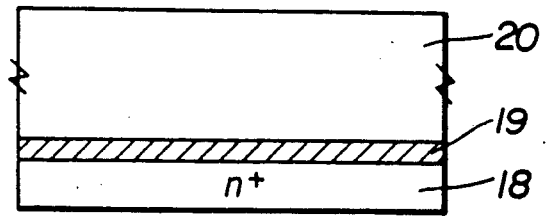

In FIG. 2C, the $n^-$-type Si substrate 17 which is (100) plane oriented is removed by an etching process using an etchant including an alkaline solution such as ethylene amine and potassium hydroxide (KOH). The (100) plane oriented $n^-$-type Si is etched with a large etching rate by the alkaline solution while an $N^+$-type Si having a high impurity concentration in the order of $10^{20}$ cm$^{-3}$ will essentially be not etched by the alkaline solution. As a result, the (100) plane oriented $n^-$-type Si substrate 17 is removed in its entirety but the $N^+$-type diffusion layer 18 remains after the etching which uses the alkaline solution.

Figure 2D:
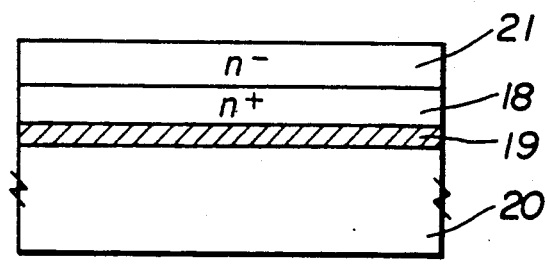

In FIG. 2D, the semiconductor device is turned upside down and an $n^-$-type Si layer 21 is formed on the $N^+$-type diffusion layer 18 by an epitaxial growth process. The $n^-$-type layer 21 is used as an active layer in which elements of the semiconductor device are formed. For example, the epitaxial growth process is a chemical vapor deposition at 1000° C. in a gas mixture including monosilane (SiH$_4$) gas and phosphine (PH$_3$), and the $n^-$-type layer 21 is formed at a rate of 0.5 micron per minute. In this embodiment, the chemical vapor deposition is carried out for a time of 4 minutes to form the $n^-$-type layer 21 to a thickness of 2 microns. It is possible to adjust the resistivity of the $n^-$-type layer 21 by adjusting the quantity of the PH$_3$ gas in the gas mixture.

Figure 2E:
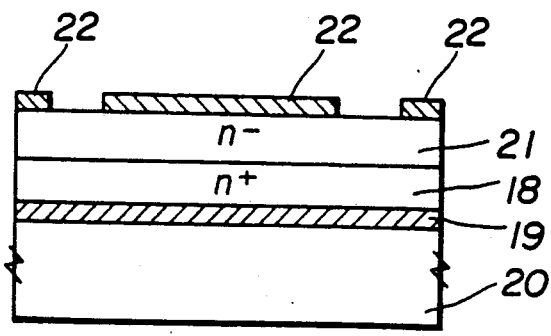

In FIG. 2E, a photoresist layer 22 is formed on the $n^-$-type layer 21 and the photoresist layer 22 is patterned into a predetermined pattern by a patterning process. The patterned photoresist layer 22 is used as a mask and a known reactive ion etching is carried out to etch the $n^-$-type layer 21 and the $N^+$-type diffusion layer 18 by an anisotropic etching.

Figure 2F:
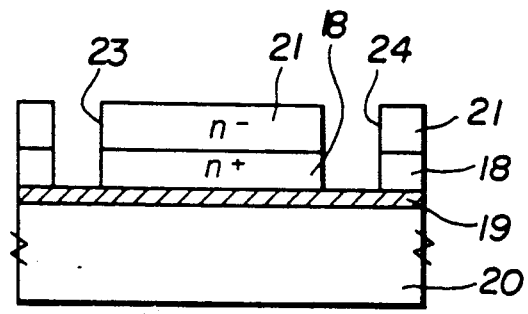

Hence, as shown in FIG. 2F, grooves 23 and 24 are formed at positions where no photoresist layer 22 was provided on the $n^-$-type layer 21. The patterned photoresist layer 22 is then removed.

Figure 2G:
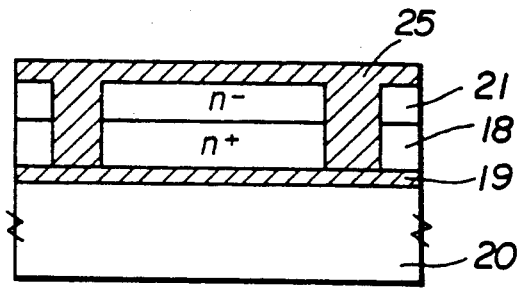

Next, as shown in FIG. 2G, a SiO$_2$ layer 25 is formed inside the grooves 23 and 24 and on the $n^-$-type layer 21 by a chemical vapor deposition. In addition, the SiO$_2$ layer 25 is etched back so as to make a surface of the SiO$_2$ layer 25 flat, and an insular region is defined by the SiO$_2$ layer 25.

Figure 2H:
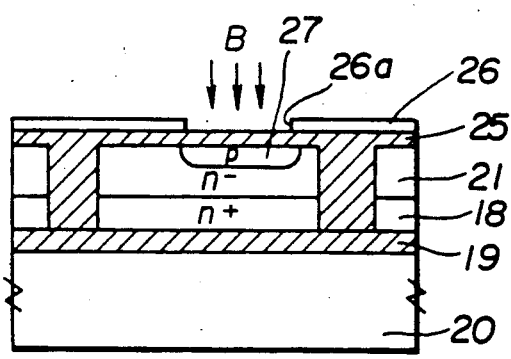

In FIG. 2H, a photoresist layer 26 is formed on the SiO$_2$ layer 25 and is patterned into a mask for having a window 26a through which boron (B) ions are implanted to form a p-type diffusion region 27.

Figure 2I:
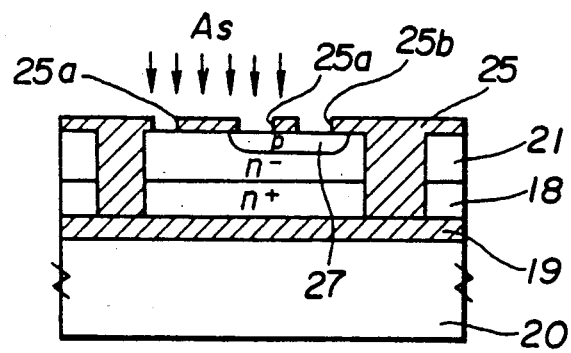
Figure 2J:
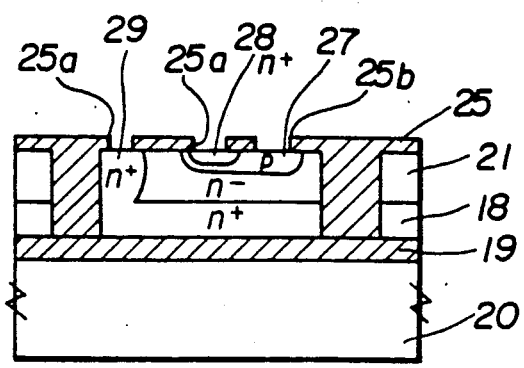

Then, as shown in FIG. 2I, the photoresist layer 26 is removed and the SiO$_2$ layer 25 is patterned by a known patterning process. The patterned SiO$_2$ layer 26 is used as a mask having windows 25a through which arsenide (As) ions are implanted to form an N$^+$-type diffusion region 28 in the p-type diffusion region 27 and an N$^+$-type diffusion region 29 in the n$^-$-type layer 21 as shown in FIG. 2J. The N$^+$-type diffusion region 29 reaches the N$^+$-type diffusion layer 18. Although not shown in FIG. 2I, a mask covers a hole 25b in the patterned SiO$_2$ layer 25 so that the p-type diffusion layer 27 remains unaffected by the As ion implantation.

The p-type diffusion region 27 is used as a base region of an npn bipolar transistor, the N$^+$-type diffusion region 28 is used as an emitter region of the npn bipolar transistor, and the N$^+$-type diffusion region 29 is used as a collector region of the npn bipolar transistor.

Although not shown in FIG. 2J, a base electrode, an emitter electrode and a collector electrode are thereafter formed at the windows 25b and 25a respectively corresponding to the base region (27), the emitter region (28) and the collector region (29).

In this embodiment, the n$^-$-type layer 21 is formed on the N$^+$-type diffusion layer 18 after once removing the n$^-$-type Si substrate 17 in its entirety. As described before, the n$^-$-type layer 21 is formed by the epitaxial growth process which can control the thickness of the n$^-$-type layer 21 formed with an extremely high accuracy compared to the conventional method described before which simply etches back a portion of the n-type Si wafer to form the active layer in which the elements of the semiconductor device are formed. For this reason, it is possible to accurately control the characteristics of the elements formed in the active layer of the semiconductor device, and semiconductors having desired element characteristics can be produced with a high yield.

Next, a description will be given of a second embodiment of the method of producing a semiconductor device according to the present invention, by referring to FIGS. 3A through 3D. In FIGS. 3A through 3D, those parts which are essentially the same as those corresponding parts in FIGS. 2A through 2J are designated by the same reference numerals, and a description thereof will be omitted.

Figure 3A:
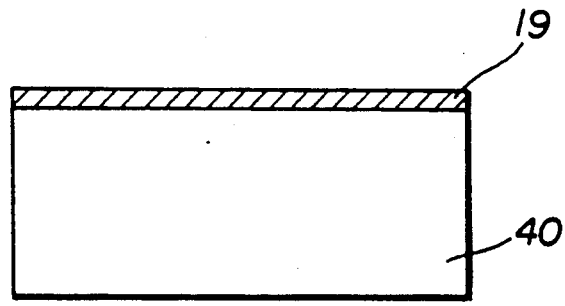
FIGS. 3A through 3D are cross sectional views for explaining a second embodiment of the method of producing a semiconductor device according to the present invention.

In FIG. 3A, the oxide layer 19 is formed on an n$^+$-type Si substrate 40 having an impurity concentration in a range of $10^{19}$ cm$^{-3}$ to $10^{20}$ cm$^{-3}$.

Figure 3B:
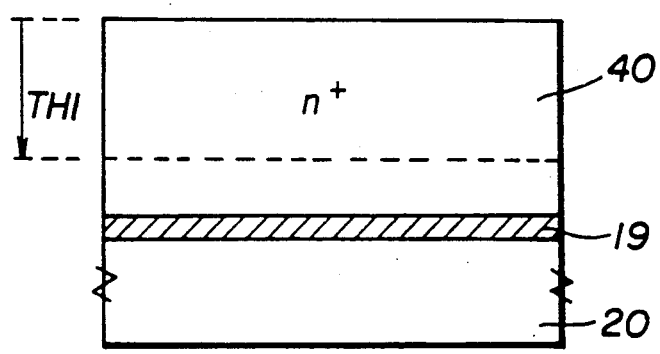

Then, the wafer 20 is adhered on the oxide layer 19 by a thermal bonding process as shown in FIG. 3B, and the N$^+$-type Si substrate 40 is polished or etched to remove a predetermined thickness TH1 thereof. For example, an etchant including hydrofluoric acid (HF), nitric acid (HNO$_3$) and acetic acid (CH$_3$cooH) with a ratio 1:3:1 may be used to remove a portion of the N$^+$-type Si substrate 40 corresponding to the predetermined thickness TH1.

Figure 3C:
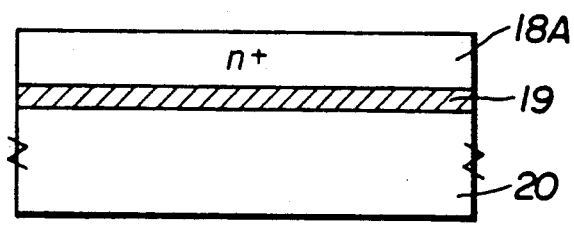

As a result, an N$^+$-type diffusion layer 18A of a desired thickness remains on the oxide layer 19 as shown in FIG. 3C.

Figure 3D:
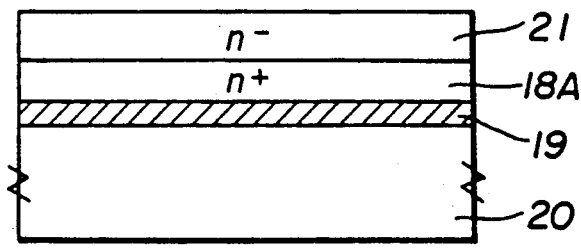

Next, the n$^-$-type layer 21 shown in FIG. 3D is formed on the N$^+$-type diffusion layer 18A by an epitaxial growth process similarly as described before in conjunction with FIG. 2D, and the processes carried out thereafter may be the same as those described before in conjunction with FIGS. 2E through 2J.

In this embodiment, the polished surface of the N$^+$-type Si substrate 40 (that is, the N$^+$-type diffusion layer 18A) may not be perfect, but there is virtually no undesirable effects on the element characteristics when used as a buried layer for reducing the resistivity of the collector, and the buried layer can be obtained through simple processes. It is of course possible to carry out an etching using potassium hydroxide (KOH) at the last stage of the polishing process so as to finish the surface of the N$^+$-type diffusion layer 18A to a perfect mirror surface.

Next, a description will be given of a third embodiment of the method of producing a semiconductor device according to the present invention, by referring to FIGS. 4A through 4D. In FIGS. 4A through 4D, those parts which are essentially the same as those corresponding parts in FIGS. 2A through 2J are designated by the same reference numerals, and a description thereof will be omitted.

Figure 4:
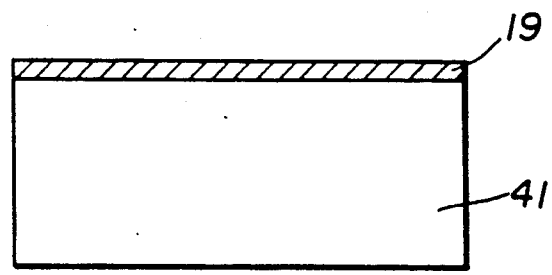
FIGS. 4A through 4D are cross sectional views for explaining a third embodiment of the method of producing a semiconductor device according to the present invention.
Figure 4:
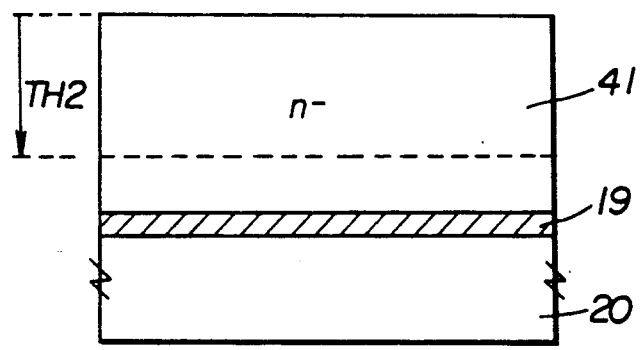
Figure 4:
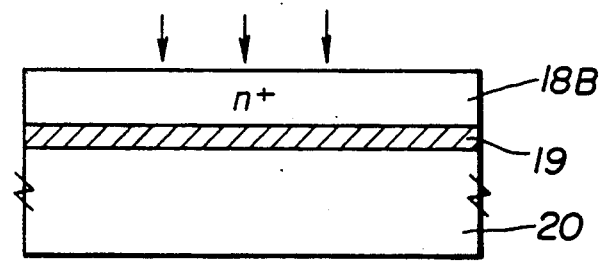
Figure 4:
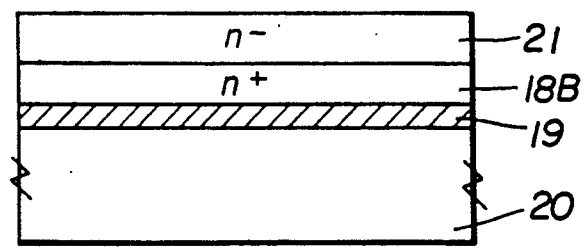

In FIG. 4A, the oxide layer 19 is formed on an n$^-$-type Si substrate 41 having an impurity concentration in the order of $10^{16}$ cm$^{-3}$.

Then, the wafer 20 is adhered on the oxide layer 19 by a thermal bonding process as shown in FIG. 4B, and the n$^-$-type Si substrate 41 is polished or etched to remove a predetermined thickness TH2 thereof. For example, an etchant including an alkaline solution such as ethylene amine and potassium hydroxide (KOH) may be used to remove a portion of the n$^-$-type Si substrate 41 corresponding to the predetermined thickness TH2.

As a result, an n$^-$-type diffusion layer of a desired thickness remains on the oxide layer 19 and this n$^-$-type layer is converted into an N$^+$-type diffusion layer 18B shown in FIG. 4C by a doping process. The N$^+$-type diffusion layer 18B has an impurity concentration in a range of $10^{19}$ cm$^{-3}$ to $10^{20}$ cm$^{-3}$.

Next, the n$^-$-type layer 21 shown in FIG. 4D is formed on the N$^+$-type diffusion layer 18B by an epitaxial growth process similarly as described before in conjunction with FIG. 2D, and the processes carried out thereafter may be the same as those described before in conjunction with FIGS. 2E through 2J.

In this embodiment, the polished surface of the n$^-$-type Si substrate 41 (that is, the n$^-$-type diffusion layer which is converted into the N$^+$-type diffusion layer 18B) is satisfactory because the etching rate of the n$^-$-type Si substrate 41 using the alkaline solution such as KOH is sufficiently high.

Although the present invention was described heretofore with reference to an embodiment in which a bipolar transistor is formed in the active layer of the semiconductor device, it is of course possible to apply the present invention to the production of a semiconductor device having a unipolar transistor formed in the active layer.

Further, the present invention is not limited to these embodiments, but various variations and modifications may be made without departing from the scope of the present invention.

What is claimed is:

1. A method of producing a semiconductor device comprising the steps of:
preparing a stacked structure having an n-type semiconductor substrate having a first impurity concentration, an n-type first layer having a second impurity concentration higher than said first impurity concentration formed on said n-type semiconductor substrate and an insulation layer formed on said n-type first layer;

adhering a base substrate on said insulation layer;

removing said n-type semiconductor substrate in its entirety by an etching, said etching having a higher etching rate for said n-type semiconductor substrate than for said n-type first layer;

forming an n-type second layer having a third impurity concentration lower than said second impurity concentration on said n-type first layer by an epitaxial growth;

selectively forming a groove which extends from a surface of said n-type second layer to said insulation layer;

filling an insulator in said groove; and forming at least one element in said n-type second layer which constitutes an active layer.

2. A method of producing a semiconductor device as claimed in claim 1 in which said step of adhering said base substrate on said insulation layer is a thermal bonding process.

3. A method of producing a semiconductor device as claimed in claim 1 in which said n-type semiconductor substrate is made of n-type silicon and said step of removing said n-type semiconductor substrate in its entirety is an etching process using an alkaline etchant.

4. A method of producing a semiconductor device as claimed in claim 1 in which said n-type first layer is made of n-type silicon, and said step of removing said n-type semiconductor substrate in its entirety uses an alkaline etchant selected from a group including ethylene amine and potassium hydroxide, KOH.

5. A method of producing a semiconductor device as claimed in claim 1 in which said step of forming at least an element in said n-type second layer forms an npn bipolar transistor having a p-type base region formed in said n-type second layer, an n-type emitter region formed in said p-type base region and an n-type collector region formed in said n-type second layer.

6. A method of producing a semiconductor device as claimed in claim 1 in which said step of forming at least an element in said n-type second layer forms said n-type collector region which reaches said n-type first layer.

7. A method of producing a semiconductor device as claimed in claim 1 in which said n-type semiconductor substrate is made of n-type silicon which is (100) plane oriented and said step of removing said n-type semiconductor substrate in its entirety is an etching process using an alkaline etchant.

8. A method of producing a semiconductor device as claimed in claim 7 in which said n-type first layer is made of n-type silicon, and said step of removing said n-type semiconductor substrate in its entirety uses an alkaline etchant selected from a group including ethylene amine and potassium hydroxide, KOH.

9. A method of producing a semiconductor device in a silicon-on-insulator structure comprising the steps of:

doping n-type impurities into an n-type semiconductor substrate having a first predetermined impurity concentration so as to increase the n-type impurity concentration above said first predetermined impurity concentration in a portion of said substrate;

forming an insulation layer on said n-type semiconductor substrate whereby said insulation layer is formed on said increased impurity concentration portion of said substrate;

adhering a base substrate on said insulation layer;

removing by at least one of polishing and etching a predetermined thickness of said n-type semiconductor substrate from a surface of said n-type semiconductor substrate opposite a surface on which said insulation layer is formed;

forming an n-type semiconductor layer having a second predetermined impurity concentration on a remaining portion of said n-type semiconductor substrate to a predetermined thickness by an epitaxial growth;

selectively forming a groove which extends from a surface of said n-type semiconductor layer to said insulation layer;

filling an insulator in said groove; and forming at least one element in said n-type semiconductor layer which constitutes an active layer.

* * * * *